(12) United States Patent
Tseng et al.

(10) Patent No.: US 8,494,820 B2
(45) Date of Patent: Jul. 23, 2013

(54) COMPUTING DEVICE AND METHOD FOR ANALYZING SCATTERING PARAMETERS PASSIVITY

(75) Inventors: Wen-Laing Tseng, Taipei Hsien (TW); Shen-Chun Li, Tu-Cheng (TW); Shou-Kuo Hsu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 247 days.

(21) Appl. No.: 12/967,051

(22) Filed: Dec. 14, 2010

(65) Prior Publication Data

US 2012/0029887 A1 Feb. 2, 2012

(30) Foreign Application Priority Data

Jul. 29, 2010 (TW) .................................. 99125040

(51) Int. Cl.
*G06F 7/60* (2006.01)
*G06F 17/50* (2006.01)

(52) U.S. Cl.
USPC .................................. 703/2; 702/57; 703/13

(58) Field of Classification Search
USPC ...................................... 703/2, 3, 14; 702/57
See application file for complete search history.

(56) References Cited

U.S. PATENT DOCUMENTS

| | | | | |
|---|---|---|---|---|
| 6,504,885 | B1 * | 1/2003 | Chen | 375/350 |
| 7,492,243 | B2 * | 2/2009 | Hidaka et al. | 333/204 |
| 7,994,801 | B2 * | 8/2011 | Hagerup et al. | 324/601 |
| 7,996,169 | B2 * | 8/2011 | Lin et al. | 702/75 |
| 8,155,934 | B2 * | 4/2012 | Gustavsen et al. | 703/2 |
| 8,234,098 | B2 * | 7/2012 | Paxson et al. | 703/11 |
| 2003/0088394 | A1 * | 5/2003 | Min et al. | 703/14 |
| 2006/0010406 | A1 * | 1/2006 | Lee et al. | 716/5 |
| 2007/0005324 | A1 * | 1/2007 | Gong et al. | 703/14 |
| 2009/0171604 | A1 * | 7/2009 | Lin et al. | 702/75 |
| 2011/0137632 | A1 * | 6/2011 | Paxson et al. | 703/11 |
| 2012/0143584 | A1 * | 6/2012 | Tseng et al. | 703/14 |

OTHER PUBLICATIONS

Fast Passivity Assessment for S-Parameter Rational Models Via a Half-Size Test Matrix, Bjorn Gustavsen and Adam Semlyen, IEEE Transactions on Microwave Theory and Techniques, Vo. 56, No. 12, pp. 2701-2708, Dec. 2008 (Gustavsen, et al.).*
Enforcing Passivity of Macromodels via Spectral Pertrubation of Hamiltonian Matrices, S. Grivet-Talocia, Dept. of Electronics, Politecnico di Torino, IEEE SPI, May 2003 (Grivet-Talocia).*
Automated Construction of Macromodels from Frequency Data for Simulation of Distributed Interconnect Networks, Sung-Hwan Min, Georgia Institute of Technology, Apr. 2004.*
Passivity Enforcement via Perturbation of Hamiltonian Matrices, Stefano Grivet-Talocia, IEEE Transactions on Circuits and Systems-I: Regular Papers, vol. 51, No. 9, Sep. 2004.*
User's Guide for vectfit3.m (Fast, Relaxed Vector Fitting), Bjorn Gustavsen, SINTEF Energy Research, Norway, Last Revised Aug. 8, 2008; http://www.energy.sintef.no/Produkt/VECTFIT/index.asp : VFIT3.zip.*

* cited by examiner

*Primary Examiner* — Omar Fernandez Rivas
*Assistant Examiner* — Maryam Ipakchi
(74) *Attorney, Agent, or Firm* — Altis Law Group, Inc.

(57) ABSTRACT

A computing device and a method measures scattering parameters (S-parameters) values at ports of a circuit at different signal frequencies, and creates a non-common-pole rational function of S-parameters by applying a vector fitting algorithm to the S-parameters. A matrix of the non-common-pole rational function is converted to a state-space matrix, and the state-space matrix is substituted into a Hamiltonian matrix. The device and method further analyzes if eigenvalues of the Hamiltonian matrix have pure imaginaries, to determine if the non-common-pole rational function of the S-parameters satisfies a passivity requirement.

15 Claims, 6 Drawing Sheets

| $0.099\times 10^9 j$ | $0.202\times 10^9 j$ | $0.455\times 10^9 j$ | $1.014\times 10^9 j$ | $5.154\times 10^9 j$ | $9.114\times 10^9 j$ |
|---|---|---|---|---|---|
| $9.820\times 10^9 j$ | $9.889\times 10^9 j$ | $10.441\times 10^9 j$ | $11.041\times 10^9 j$ | $13.728\times 10^9 j$ | $15.112\times 10^9 j$ |
| $17.012\times 10^9 j$ | $18.249\times 10^9 j$ | $18.848\times 10^9 j$ | $19.964\times 10^9 j$ | $20.194\times 10^9 j$ | $21.256\times 10^9 j$ |

FIG. 6

COMPUTING DEVICE AND METHOD FOR ANALYZING SCATTERING PARAMETERS PASSIVITY

BACKGROUND

1. Technical Field

Embodiments of the present disclosure relates to circuit simulating methods, and more particularly, to a computing device and a method for analyzing scattering parameters (S-parameters) passivity.

2. Description of Related Art

Scattering parameters (S-parameters) are useful for analyzing behaviour of circuits without regard to detailed components of the circuits. The S-parameters may be measured at ports of a circuit at different signal frequencies. In a high frequency and microwave circuit design, the S-parameters of the circuit may be used to create a rational function, and the rational function may be used to generate an equivalent circuit model, which may be applied to time-domain analysis for the circuit design. For judging whether the circuit design satisfies stability requirements, the time-domain analysis result should be convergent. To ensure constringency, the rational function and the equivalent circuit model of the S-parameters are required to be passive.

BRIEF DESCRIPTION OF THE DRAWINGS

FIG. 6 is one embodiment of pure imaginaries of a Hamiltonian matrix.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

In general, the word "module," as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
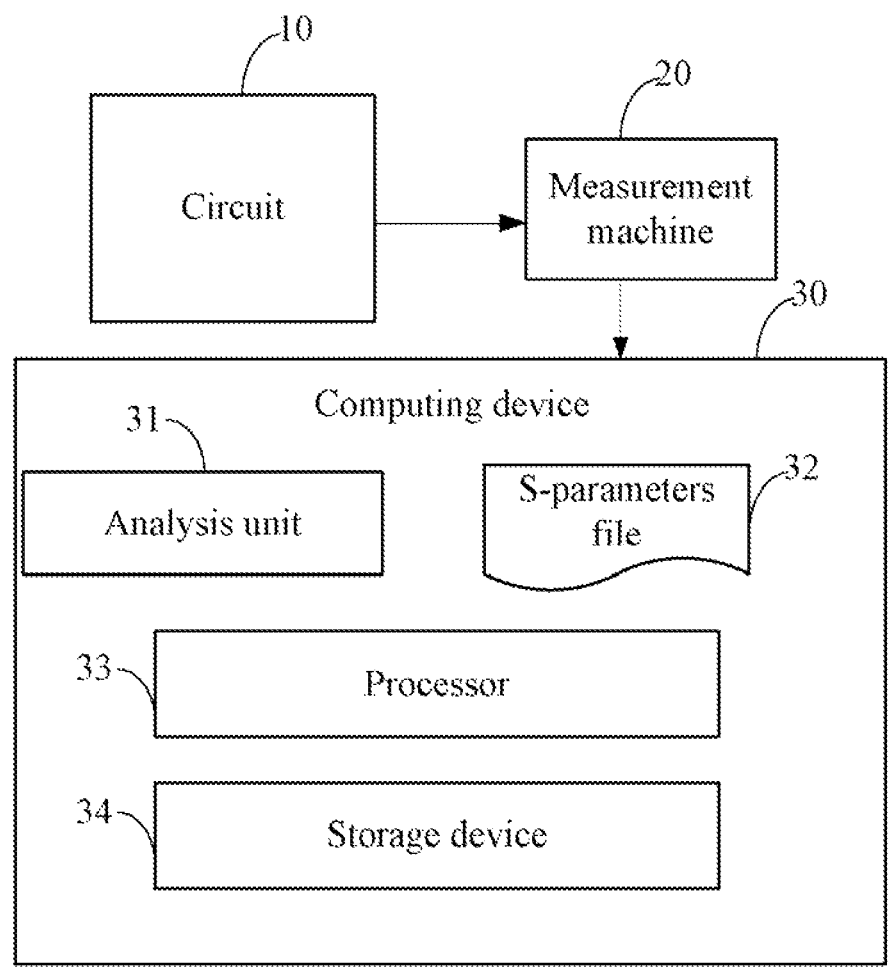
FIG. 1 is a block diagram of one embodiment of a computing device for analyzing S-parameters passivity.

FIG. 1 is a block diagram of one embodiment of a computing device 30. The computing device 30 is connected to a measurement device 20. The measurement device 20 measures S-parameters at ports of a circuit 10, to obtain an S-parameters file 32, and stores the S-parameters file 32 in a storage device 34 of the computing device 30. Depending on the embodiment, the storage device 34 may be a smart media card, a secure digital card, or a compact flash card. The measurement device 20 may be a network analyzer. The computing device 30 may be a personal computer, or a server, for example.

In this embodiment, the computing device 30 further includes an analysis unit 31 and a processor 33. The analysis unit 31 includes a number of function modules (depicted in FIG. 2) The function modules may comprise computerized code in the form of one or more programs that are stored in the storage device 34. The computerized code includes instructions that are executed by the at least one processor 33, to create a non-common-pole rational function of the S-parameters, generate an equivalent circuit model 315 of the circuit 10 according to the non-common-pole rational function, and analyze if non-common-pole rational function satisfies passivity requirements, so as to determine if the equivalent circuit model 315 satisfies passivity requirements.

Figure 2:
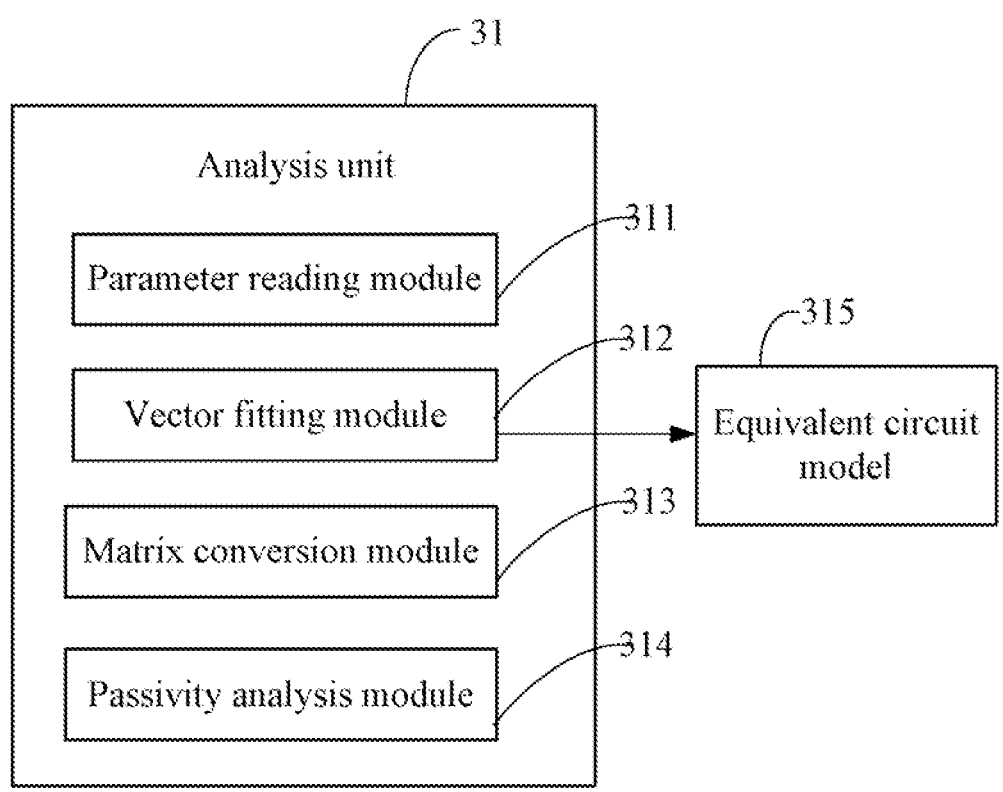
FIG. 2 is a block diagram of one embodiment of function modules of an analysis unit in the computing device of FIG. 1.

FIG. 2 is a block diagram of the function modules of the analysis unit 31 in the computing device of FIG. 1. The analysis unit 31 includes a parameter reading module 311, a vector fitting module 312, a matrix conversion module 313, and a passivity analysis module 314. A description of functions of the modules 311 to 314 are included in the following description of FIG. 3.

Figure 3:
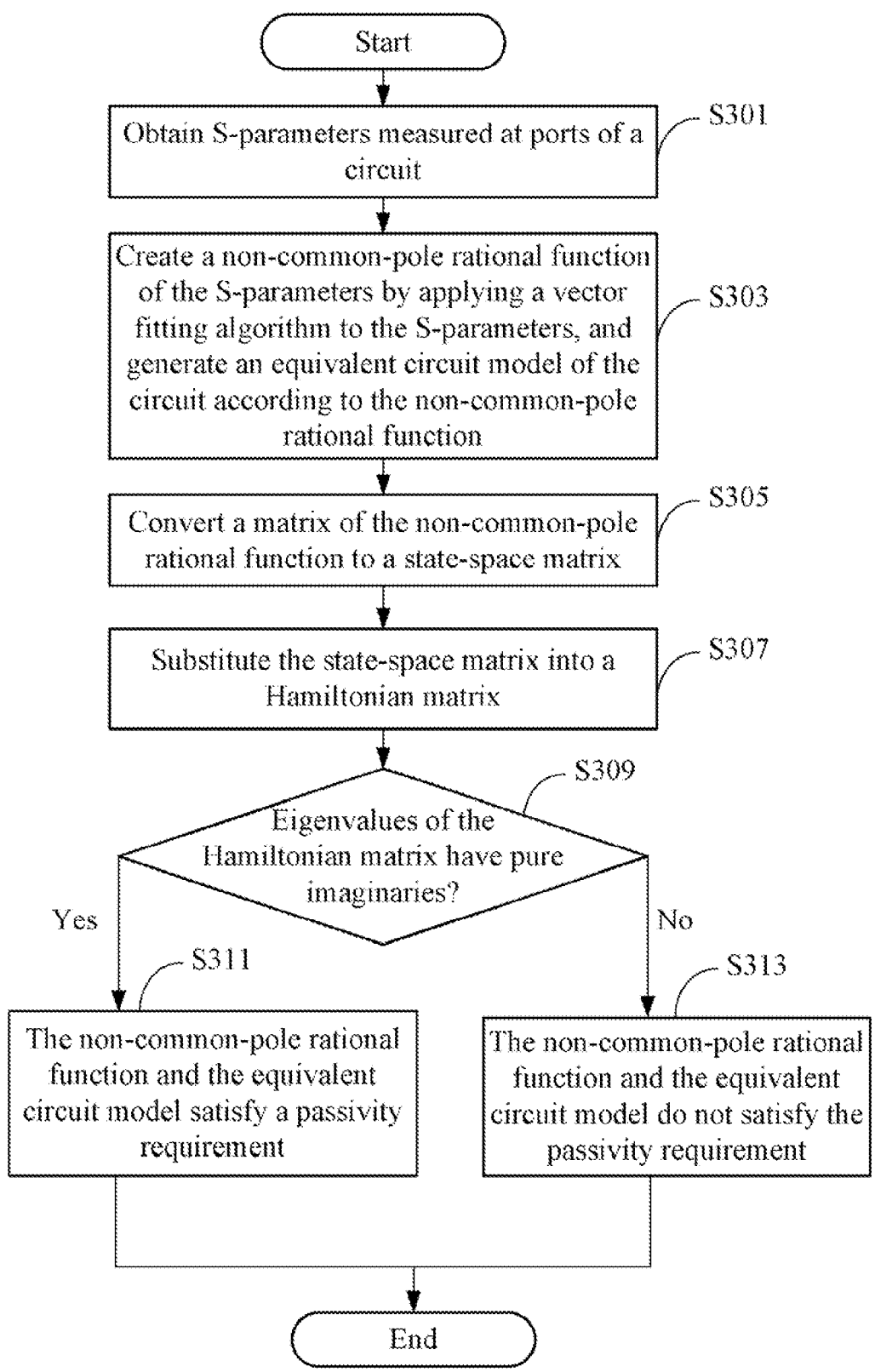
FIG. 3 is a flowchart of one embodiment of a method for analyzing S-parameters passivity.

FIG. 3 is a flowchart of one embodiment of a method for analyzing S-parameters passivity. Depending on the embodiment, additional blocks may be added, others removed, and the ordering of the blocks may be changed.

Figure 4:
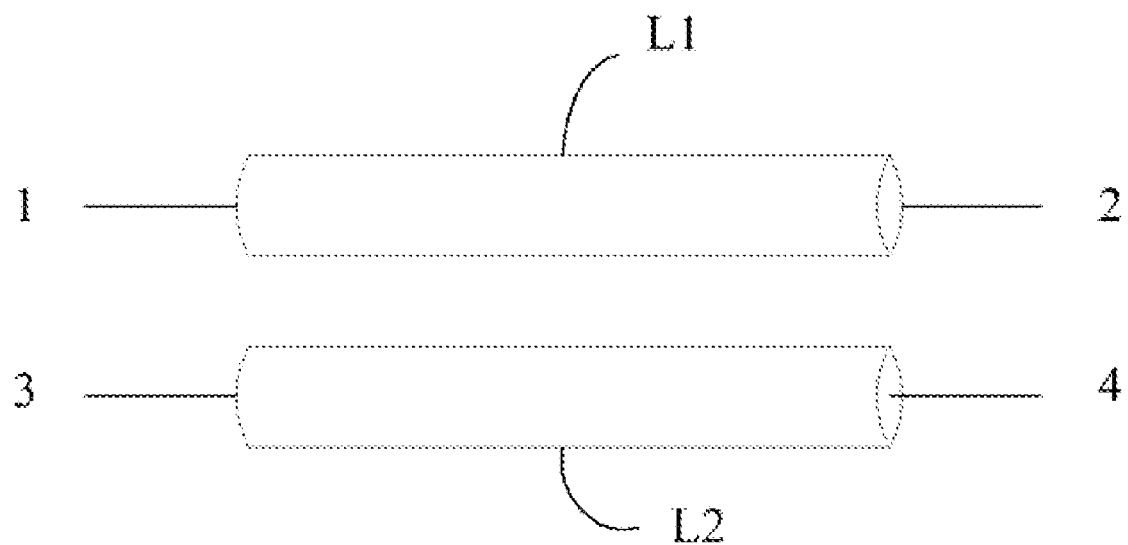
FIG. 4 is one embodiment of four-port differential transmission lines in a circuit.

In block S301, the measurement device 20 measures the S-parameters at the ports of the circuit 10, to obtain the S-parameters file 32, and stores the S-parameters file 32 in the storage device 34. The parameter reading module 311 reads the S-parameters file 32 from the storage device 34. In one embodiment, the S-parameters include reflection coefficients, insertion loss coefficients, near-end crosstalk coefficients, and remote-end crosstalk coefficients of each port in the circuit 10. The S-parameters file 32 records S-parameter values measured at ports of the circuit 10 at different signal frequencies. For example, suppose a differential transmission line 11 of the circuit 10 includes four ports numbered 1, 2, 3, and 4 as shown in FIG. 4. When a test signal is input to the port 1, the port 1 will receive a reflection signal, and the ports 2, 3, 4 will respectively receive a first, a second, and a third transmission signal. Then, a ratio of the reflection signal power and the test signal power is regarded as a reflection coefficient S11, a ratio of the second transmission signal power and the test signal power is regarded as an insertion loss coefficient S12, a ratio of the third transmission signal power and the test signal power is regarded as a near-end crosstalk coefficient S13, and a ratio of the third transmission signal power and the test signal power is regarded as a remote-end crosstalk coefficient S14. When a frequency of the test signal changes, values of the ratios change, so the S-parameters file 32 records a large quantity of S-parameter values.

In block S303, the vector fitting module 312 creates a non-common-pole rational function of the S-parameters by applying a vector fitting algorithm to the S-parameters, and generates the equivalent circuit model 315 of the circuit 10 according to the non-common-pole rational function.

It is understood that, two modes of rational functions may be created for the S-parameters by applying the vector fitting algorithm to the S-parameters. One is the common-pole style labeled (1a), the other is the non-common pole style labeled (1b).

$$S(s) \approx \left\{ \sum_{m=1}^{M} \left[ \begin{matrix} r_m^{1,1} & r_m^{1,2} & \cdots & r_m^{1,N} \\ r_m^{2,1} & r_m^{2,2} & \cdots & r_m^{2,N} \\ \cdots & \cdots & \cdots & \cdots \\ r_m^{N,1} & r_m^{N,2} & \cdots & r_m^{N,N} \end{matrix} \right] \middle/ s + p_m \right\} + \left[ \begin{matrix} d_m^{1,1} & d_m^{1,2} & \cdots & d_m^{1,N} \\ d_m^{2,1} & d_m^{2,2} & \cdots & d_m^{2,N} \\ \cdots & \cdots & \cdots & \cdots \\ d_m^{N,1} & d_m^{N,2} & \cdots & d_m^{N,N} \end{matrix} \right] \quad (1a)$$

$$S(s) \approx \left\{ \sum_{m=1}^{M} \left[ \begin{matrix} \frac{r_m^{1,1}}{s+p_m^{1,1}} & \frac{r_m^{1,2}}{s+p_m^{1,2}} & \cdots & \frac{r_m^{1,N}}{s+p_m^{1,N}} \\ \frac{r_m^{2,1}}{s+p_m^{2,1}} & \frac{r_m^{2,2}}{s+p_m^{2,2}} & \cdots & \frac{r_m^{2,N}}{s+p_m^{2,N}} \\ \cdots & \cdots & \cdots & \cdots \\ \frac{r_m^{N,1}}{s+p_m^{N,1}} & \frac{r_m^{N,2}}{s+p_m^{N,2}} & \cdots & \frac{r_m^{N,N}}{s+p_m^{N,N}} \end{matrix} \right] \right\} + \left[ \begin{matrix} d_m^{1,1} & d_m^{1,2} & \cdots & d_m^{1,N} \\ d_m^{2,1} & d_m^{2,2} & \cdots & d_m^{2,N} \\ \cdots & \cdots & \cdots & \cdots \\ d_m^{N,1} & d_m^{N,2} & \cdots & d_m^{N,N} \end{matrix} \right] \quad (1b)$$

where M represents a control precision of the function (either common-pole or non-common-pole), N represents a number of the ports of the circuit 10, $r_m$ represents residue values, $p_m$ represents pole values, $s=\omega=2\pi f$, f represents a frequency of the test signal, and $d_m$ represents a constant. It is understood that the control precision means how many pairs of pole-residue values are utilized in the function (1a) or (1b).

Figure 5:
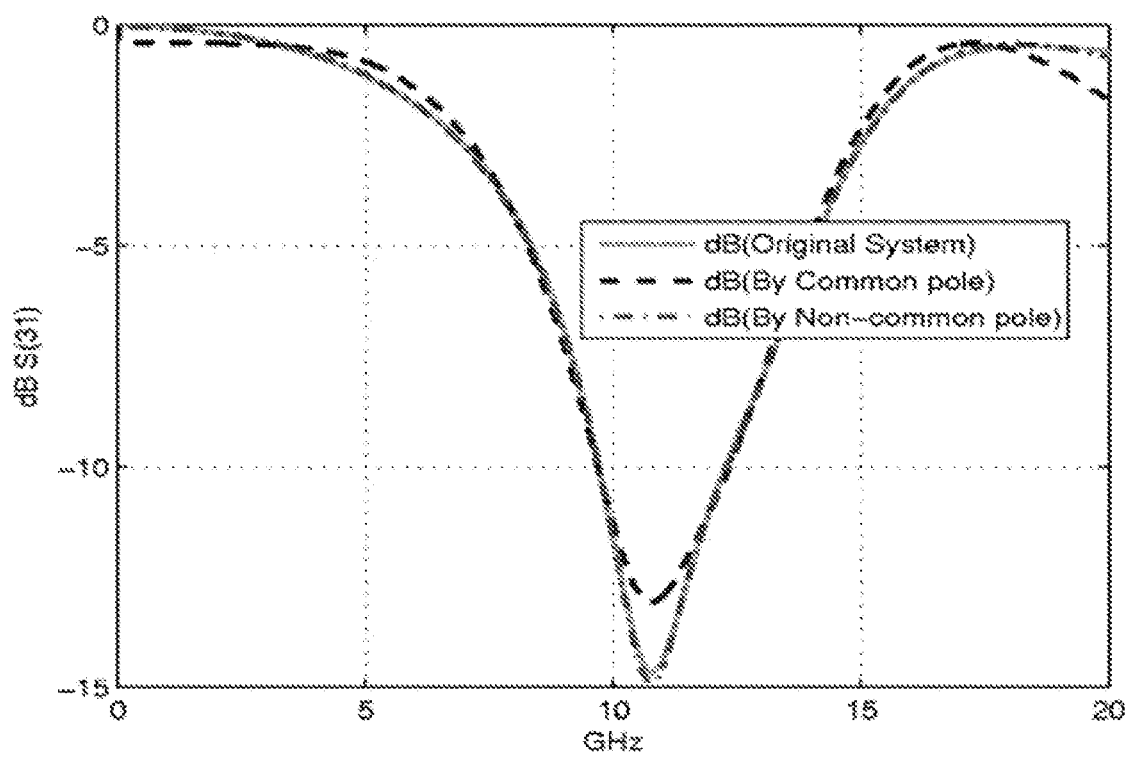
FIG. 5 is one embodiment of a common-pole rational function and a non-common-pole rational function of the S-parameters measured at the ports shown in FIG. 4.

FIG. 5 shows a real line and two broken lines. The real line represents an original curve of the S-parameters. The two broken lines represent curves of the rational functions (1a) and (1b), which utilize eight pairs of pole-residue values in the vector fitting algorithm of the S-parameters of the four ports shown in FIG. 4. In FIG. 5, the horizontal axis represents the frequency of the test signal, the vertical axis represents an amplitude of the test signal. It can be seen in FIG. 5 that the curve of the non-common-pole function approaches the original curve much better than the curve of the common-pole function, which means the non-common-pole function has a higher fitting precision than the common-pole function. Therefore, in this embodiment, the non-common-pole rational function is used for analyzing passivity of the S-parameters.

A matrix of the non-common-pole rational function labeled as (1b) is as follows:

$$S(s) \approx \hat{S}(s) = \begin{bmatrix} \hat{S}_{11}(s) & \hat{S}_{12}(s) & \cdots & \hat{S}_{1N}(s) \\ \hat{S}_{21}(s) & \hat{S}_{22}(s) & \cdots & \hat{S}_{2N}(s) \\ \cdots & \cdots & \cdots & \cdots \\ \hat{S}_{N1}(s) & \hat{S}_{N2}(s) & \cdots & \hat{S}_{NN}(s) \end{bmatrix} \quad (2)$$

where $\hat{S}_{p,q}(s) = \hat{S}r_{p,q}(s) + \hat{S}c_{p,q}(s) + d^{p,q}$, $\hat{S}r_{p,q}(s)$ represents pole values, and a real number expression function of $\hat{S}r_{p,q}(s)$ is labeled (3a). $\hat{S}c_{p,q}(s)$ represents residue values, and a complex number expression function of $\hat{S}c_{p,q}(s)$ is labeled (3b).

$$\hat{S}r_{p,q}(s) = \sum_{u=1}^{U} \frac{r_u^{p,q}}{s+p_u^{p,q}} \quad (3a)$$

where $p_u^{p,q}$ and $r_u^{p,q}$ are real numbers.

$$\hat{S}c_{p,q}(s) = \sum_{v=1}^{V} \frac{\text{Re}(r_v^{p,q}) + \text{Im}(r_v^{p,q})j}{s + \text{Re}(p_v^{p,q}) + \text{Im}(p_v^{p,q})j} + \frac{\text{Re}(r_v^{p,q}) - \text{Im}(r_v^{p,q})j}{s + \text{Re}(p_v^{p,q}) - \text{Im}(p_v^{p,q})j} \quad (3b)$$

where $j=\sqrt{-1}$, $U+2V=M$, $p_u^{p,q} > 0$, and $\text{Re}(p_v^{p,q}) > 0$.

In block S305, the matrix conversion module 313 converts the matrix of the non-common-pole rational function to a state-space matrix. For example, the matrix conversion module 313 combines the matrix (2) and the expression functions (3a) and (3b) to obtain a combined matrix, then converts the combined matrix into the state-space matrix as follows:

$$j\omega X(j\omega) = AX(j\omega) + BU(j\omega)$$

$$Y(j\omega) = CX(j\omega) + DU(j\omega) \quad (4)$$

Where the matrixes A, B, C, and D may be expressed as follows:

$$A = \begin{bmatrix} A_r & 0 \\ 0 & A_c \end{bmatrix}, B = \begin{bmatrix} B_r \\ B_c \end{bmatrix}, C = [\, C_r \;\; C_c \,], \quad (5)$$

$$D = \begin{bmatrix} d^{1,1} & d^{1,2} & \cdots & d^{1,N} \\ d^{2,1} & d^{2,2} & \cdots & d^{2,N} \\ \cdots & \cdots & \cdots & \cdots \\ d^{N,1} & d^{N,1} & \cdots & d^{N,N} \end{bmatrix}$$

where $A_r$, $B_r$ and $C_r$ are state-space matrixes of the pole values $\hat{S}r_{p,q}(s)$ in (3a), and may be expressed as follows:

$$A_r(i,j) = \begin{cases} p_0^{p,q}, & i=j \text{ and } i=(U\cdot N)(p-1)+U(q-1)+u \\ 0 & o.w. \end{cases} \quad (6)$$

$$B_r(i,j) = \begin{cases} 1, & i=(U\cdot N)(p-1)+U(q-1)+u \text{ and } j=q \\ 0 & o.w. \end{cases}$$

$$C_r(i,j) = \begin{cases} r_u^{p,q}, & i=p \text{ and } j=(U\cdot N)(p-1)+U(q-1)+u \\ 0 & o.w. \end{cases}$$

where $A_r$ is a $(N\cdot N\cdot U) \times (N\cdot N\cdot U)$ sparse matrix, $B_r$ is a $(N\cdot U) \times N$ sparse matrix, $C_r$ is a $N \times (N\cdot U)$ sparse matrix.

$A_c$, $B_c$, and $C_c$ are state-space matrixes of the residue values $\hat{S}c_{p,q}(s)$ in (3b), and may be expressed as follows:

$$A_c(i,j) = \begin{cases} \text{Re}(p_v^{p,q}), & i=j \text{ and } i=\Psi(p,q,v), i=\Psi(p,q,v)-1 \\ \text{Im}(p_v^{p,q}), & i=\Psi(p,q,v)-1, j=\Psi(p,q,v) \\ -\text{Im}(p_v^{p,q}), & i=\Psi(p,q,v), j=\Psi(p,q,v)-1 \\ 0, & o.w. \end{cases} \quad (7)$$

$$B_c(i,j) = \begin{cases} 2, & i=\Psi(p,q,v)-1 \text{ and } j=q \\ 0 & o.w. \end{cases}$$

$$C_c(i, j) = \begin{cases} \text{Re}(r_v^{p,q}), & i = p \text{ and } j = \Psi - 1 \\ \text{Im}(r_v^{p,q}), & i = p \text{ and } j = \Psi \\ 0, & o.w. \end{cases} \quad (5)$$

where $\Psi(p,q,v) = (2V \cdot N)(p-1) + 2V(q-1) + 2v$, $A_c$ is a sparse matrix, $B_r$ is a $(N \cdot 2V) \times N$ sparse matrix, and $C_r$ is a $N \times (N \cdot 2V)$ sparse matrix.

The matrix conversion module 313 combines the functions (5), (6), and (7) to obtain expressions of the coefficients A, B, C, and D in the state-space matrix (4).

In block S307, the passivity analysis module 314 substitutes the state-space matrix (4) into a Hamiltonian matrix, where the Hamiltonian matrix is as follows:

$$H = \begin{bmatrix} A - BR^{-1}D^TC & -BR^{-1}B^T \\ C^TQ^{-1}C & -A^T + C^TDR^{-1}B^T \end{bmatrix} \quad (8)$$

where $R = D^TD - I$, $Q = DD^T - I$, I is an identity matrix.

In block S309, the passivity analysis module 314 analyzes the eigenvalues of the Hamiltonian matrix for pure imaginaries, to determine if the non-common-pole rational function of the S-parameters satisfies a passivity requirement. If the eigenvalues of the Hamiltonian matrix have pure imaginaries, the procedure goes to block S311, the passivity analysis module 314 determines that the non-common-pole rational function of the S-parameters satisfies the passivity requirement. For example, eigenvalues of the Hamiltonian matrix (8) have pure imaginaries shown in FIG. 6, therefore, the non-common-pole rational function (2) of the S-parameters is passive. Accordingly, the passivity analysis module 314 determines that the equivalent circuit model 315 satisfies the passivity requirement.

Otherwise, if the eigenvalues of the Hamiltonian matrix have no pure imaginaries, the procedure goes to block S313, the passivity analysis module 314 determines that the non-common-pole rational function of the S-parameters does not satisfy the passivity requirement. Accordingly, the passivity analysis module 314 determines that the equivalent circuit model 315 does not satisfy the passivity requirement.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computing device, comprising:
   a storage device;
   at least one processor; and
   an analysis unit comprising one or more computerized codes, which are stored in the storage device and executable by the at least one processor, the one or more computerized codes comprising:
   a parameter reading module operable to read a scattering parameters (S-parameters) file from the storage device, wherein the S-parameters file records S-parameters values measured at ports of a circuit at different signal frequencies;
   a vector fitting module operable to create a non-common-pole rational function of the S-parameters by applying a vector fitting algorithm to the S-parameters;
   a matrix conversion module operable to convert a matrix of the non-common-pole rational function to a state-space matrix;
   a passivity analysis module operable to substitute the state-space matrix into a Hamiltonian matrix, analyze if eigenvalues of the Hamiltonian matrix have pure imaginaries, determine that the non-common-pole rational function of the S-parameters satisfies a passivity requirement if the eigenvalues of the Hamiltonian matrix have pure imaginaries, or determine that the non-common-pole rational function of the S-parameters does not satisfy the passivity requirement if the eigenvalues of the Hamiltonian matrix have no pure imaginaries.

2. The computing device as claimed in claim 1, wherein the vector fitting module is further operable to generate an equivalent circuit model of the circuit according to the non-common-pole rational function.

3. The computing device as claimed in claim 2, wherein the passivity analysis module is further operable to determine that the equivalent circuit model satisfies the passivity requirement if the non-common-pole rational function of the S-parameters satisfies the passivity requirement, or determine the equivalent circuit model does not satisfy the passivity requirement if the non-common-pole rational function of the S-parameters does not satisfy the passivity requirement.

4. The computing device as claimed in claim 1, wherein the S-parameters comprise reflection coefficients, insertion loss coefficients, near-end crosstalk coefficients, and remote-end crosstalk coefficients of each port in the circuit.

5. The computing device as claimed in claim 1, wherein the storage device is selected from the group consisting of a smart media card, a secure digital card, and a compact flash card.

6. A computer-based method for analyzing scattering parameters (S-parameters) passivity, the method comprising:
   reading an S-parameters file from a storage device, wherein the S-parameters file records S-parameters values measured at ports of a circuit at different signal frequencies;
   creating a non-common-pole rational function of the S-parameters by applying a vector fitting algorithm to the S-parameters;
   converting a matrix of the non-common-pole rational function to a state-space matrix;
   substituting the state-space matrix into a Hamiltonian matrix, and analyzing if eigenvalues of the Hamiltonian matrix have pure imaginaries; and
   determining that the non-common-pole rational function of the S-parameters satisfies a passivity requirement if the eigenvalues of the Hamiltonian matrix have pure imaginaries, or determining that the non-common-pole rational function of the S-parameters does not satisfy the passivity requirement if the eigenvalues of the Hamiltonian matrix have no pure imaginaries.

7. The method as claimed in claim 6, further comprising:
   generating an equivalent circuit model of the circuit according to the non-common-pole rational function.

8. The method as claimed in claim 7, further comprising:
   determining that the equivalent circuit model satisfies the passivity requirement if the non-common-pole rational function of the S-parameters satisfies the passivity requirement, or determining that the equivalent circuit model does not satisfy the passivity requirement if the non-common-pole rational function of the S-parameters does not satisfy the passivity requirement.

9. The method as claimed in claim 6, wherein the storage device is selected from the group consisting of a smart media card, a secure digital card, and a compact flash card.

10. The method as claimed in claim 6, wherein the S-parameters comprise reflection coefficients, insertion loss coefficients, near-end crosstalk coefficients, and remote-end crosstalk coefficients of each port of the differential transmission line.

11. A non-transitory computer readable medium storing a set of instructions, the set of instructions capable of being executed by a processor of a computing device to perform a method for analyzing scattering parameters (S-parameters) passivity, the method comprising:

reading a S-parameters file from the medium, wherein the S-parameters file records S-parameters values measured at ports of a circuit at different signal frequencies;

creating a non-common-pole rational function of the S-parameters by applying a vector fitting algorithm to the S-parameters;

converting a matrix of the non-common-pole rational function to a state-space matrix;

substituting the state-space matrix into a Hamiltonian matrix, and analyzing if eigenvalues of the Hamiltonian matrix have pure imaginaries; and determining that the non-common-pole rational function of the S-parameters satisfies a passivity requirement if the eigenvalues of the Hamiltonian matrix have pure imaginaries, or determining that the non-common-pole rational function of the S-parameters does not satisfy the passivity requirement if the eigenvalues of the Hamiltonian matrix have no pure imaginaries.

12. The medium as claimed in claim 11, wherein the method further comprises:

generating an equivalent circuit model of the circuit according to the non-common-pole rational function.

13. The medium as claimed in claim 12, wherein the method further comprises:

determining that the equivalent circuit model satisfies the passivity requirement if the non-common-pole rational function of the S-parameters satisfies the passivity requirement, or determining the equivalent circuit model does not satisfy the passivity requirement if the non-common-pole rational function of the S-parameters does not satisfy the passivity requirement.

14. The medium as claimed in claim 11, wherein the medium is selected from the group consisting of a smart media card, a secure digital card, and a compact flash card.

15. The medium as claimed in claim 11, wherein the S-parameters comprise reflection coefficients, insertion loss coefficients, near-end crosstalk coefficients, and remote-end crosstalk coefficients of each port of the differential transmission line.

\* \* \* \* \*